United States Patent [19]
Ashitomi et al.

[11] Patent Number: 5,216,411
[45] Date of Patent: Jun. 1, 1993

[54] COVER FOR AN INDICATOR PANEL WITH TRANSPARENT TOUCHPAD AND DISPLAY

[75] Inventors: Takashi Ashitomi, Tokyo; Keiji Aramaki, Saitama, both of Japan

[73] Assignee: Sony Corporation, Japan

[21] Appl. No.: 727,585

[22] Filed: Jul. 9, 1991

[30] Foreign Application Priority Data

Jul. 20, 1990 [JP] Japan ................................ 2-192618
Aug. 28, 1990 [JP] Japan ................................ 2-226126

[51] Int. Cl.⁵ ..................... G09G 3/02; G02F 1/1333; G02F 1/1335; H03K 17/96
[52] U.S. Cl. ..................................... 340/712; 341/23; 359/48; 359/62; 359/83
[58] Field of Search ....................... 359/36, 62, 48, 49, 359/50, 83; 340/711, 712, 717, 815; 341/23

[56] References Cited

U.S. PATENT DOCUMENTS

| 4,121,204 | 10/1978 | Welch et al. | 340/712 |
| 4,371,870 | 1/1983 | Bifano | 340/716 |
| 4,652,932 | 3/1987 | Miyajima et al. | 358/236 |
| 4,720,781 | 1/1988 | Crossland et al. | 340/825.35 |
| 4,870,458 | 9/1989 | Shibuya et al. | 355/200 |

Primary Examiner—William L. Sikes
Assistant Examiner—Kenneth Packer
Attorney, Agent, or Firm—Ronald P. Kananen

[57] ABSTRACT

A cover for an indicator panel of an electronic apparatus which is mounted on a recess formed on the indicator panel and pivotably movable so as to cover the indicator panel in a closed state, including a frame means which has first and second openings, a pair of hinges extending outwardly from both sides thereof and a tapered portion extending outwardly from the hinge-forming side of a lower side wall thereof, a pair of touch-sensitive panels made of a transparent material which are fitted into the first and second openings, a pair of display panels made of a transparent material mounted on the first and second openings which have touch patterns printed thereon with a transparent medium, an outer panel made of translucent acrylic resin which is disposed spaced at a given distance from the display panels, and a plurality of light sources provided in the frame means, wherein the touch patterns are reflected or projected on the touch-sensitive panels by light emitted from the light sources.

10 Claims, 9 Drawing Sheets

COVER FOR AN INDICATOR PANEL WITH TRANSPARENT TOUCHPAD AND DISPLAY

BACKGROUND OF THE INVENTION

1. Field of the Invention

This invention relates to a cover for an indicator panel of electronic apparatus, such as a video tape recorder, and particularly to a cover for an indicator panel which functions as a control panel in an open state.

2. Description of the Background Art

An audio and visual apparatus, for example, a video tape recorder has a front panel, e.g. a control panel, on which a plurality of operating buttons such as an input change-over button, a recording mode change over button and the like are provided together with a display tube. A portion of the front panel where these operating buttons are provided is usually closed with a cover which is pivotably mounted or hinged on a housing body of the video tape recorder, so that the video tape recorder is simple in its whole appearance. If the operating buttons are provided near display elements such as LEDs, the display elements may be obscured such that they are not clearly visible. Accordingly, each operating button must be arranged on the front panel considerably spaced apart from a position where display elements are provided. Alternatively, when the whole front panel is closed with the hinged cover, the same type of the display elements may be additionally provided on an outer side of the cover or lid such that indication of the display element is visible even when the front panel is in a closed state. To this end, redundant display elements are needlessly required.

As described above, size, configuration and arrangement of the operating buttons are limited by the display elements provided on the front panel. As a result, the size and configuration of the operating buttons are undesirably restricted from the viewpoint of designing for optimum operability and visibility. Furthermore, when redundant display elements are utilized as mentioned above, manufacturing costs are increased.

SUMMARY OF THE INVENTION

It is an object of the present invention to provide a cover for an indicator panel which overcomes the above disadvantages such that indication of the display tube is visible in the closed state while a plurality of touch sensitive switches are provided thereon so as to be operable in the open state.

In order to accomplish this object, there is provided a cover for an indicator panel of electronic apparatus which is mounted on a recess formed on the indicator panel and pivotably movable so as to cover the indicator panel in a closed state. The cover includes a frame means made of synthetic resin. The frame means has first and second openings, a pair of hinges extending outwardly from both sides thereof, and a tapered portion extending outwardly from the hinge-forming side of a lower side wall thereof. The frame means is pivotably supported on the indicator panel by the hinges. The tapered portion has a flat face and a slant face inclined relative to the flat face. The cover also includes a pair of touch sensitive panels made of a transparent material, a pair of display panels made of a transparent material and an outer panel made of translucent acrylic resin. The touch-sensitive panels are fitted into the first and second openings of the frame means. The display panels are mounted into the first and second openings and spaced at a given distance from the touch sensitive panels. The display panels each have touch patterns printed with a transparent ink medium on a surface thereof. The outer panel is disposed at a given distance from the display panels. In addition, a plurality of light sources are provided in the frame means so that the touch patterns are reflected or projected on the touch-sensitive panels by light emitted therefrom.

According to a further aspect of the present invention, there is provided a cover for an indicator panel of electronic apparatus which is mounted on a recess formed on the indicator panel and pivotably movable so as to cover the indicator panel in a closed state. The cover includes a frame means made of synthetic resin. The frame means has first and second openings, a pair of hinges extending outwardly from both sides thereof, a pair of tapered portions extending outwardly from the hinge forming side of a lower side wall thereof, a plurality of protrusions formed on an outside of an upper side wall thereof, and a plurality of tab portions extending perpendicularly from a front side face thereof. The frame means is pivotably supported on the indicator panel by the hinges. The tapered portion has a flat face and a slant face inclined relative to the flat face. The cover also includes a pair of touch-sensitive panels made of a transparent material, a panel holder made of synthetic resin, a pair of display panels made of a transparent material, an inner frame made of metal, and an outer panel made of translucent acrylic resin. The touch-sensitive panels are fitted into the first and second openings of the frame means. The panel holder has first and second openings, a tapered portion extending outwardly from a lower side wall thereof, and a plurality of apertures. The touch-sensitive panels are placed over the first and second openings of the panel holder such that they are fixedly adhered to a rear side face of the panel holder along peripheral edges of the openings. The apertures are formed opposite to the tab portions of the frame means such that they are inserted thereinto when the frame means and the panel holder are assembled. The display panels are mounted into the first and second openings and spaced at a given distance from the touch-sensitive panels. The display panels each have touch patterns printed with a transparent ink medium on a surface thereof. The inner frame is mounted on the outside of the panel holder such that the display panels are interposed between the panel holder and the inner frame. The outer panel has a plurality of recesses which are formed opposite to the respective protrusions of the frame means so as to be engaged with the protrusions when the frame means and the outer panel are assembled. In addition, a plurality of light sources are provided in the panel holder so that the touch patterns are reflected or projected on the touch-sensitive panels by light emitted therefrom.

DESCRIPTION OF THE PREFERRED EMBODIMENT

The preferred embodiment of a cover for a indicator panel of a video tape recorder according to the present invention will now be described with reference to the accompanying drawings.

Figure 1:
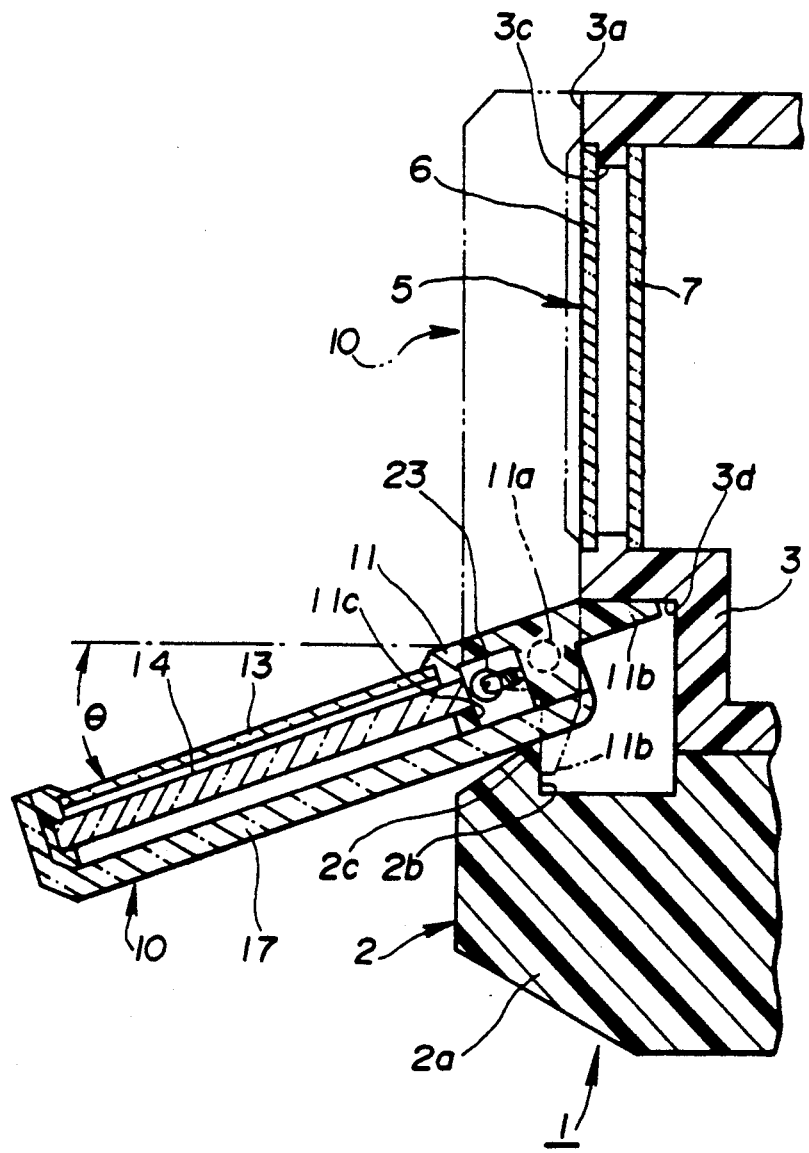
FIG. 1 is a sectional view of of a cover for an indicator panel of a video tape recorder according to a first embodiment of the present invention, taken along line I—I in FIG. 3.
Figure 2:
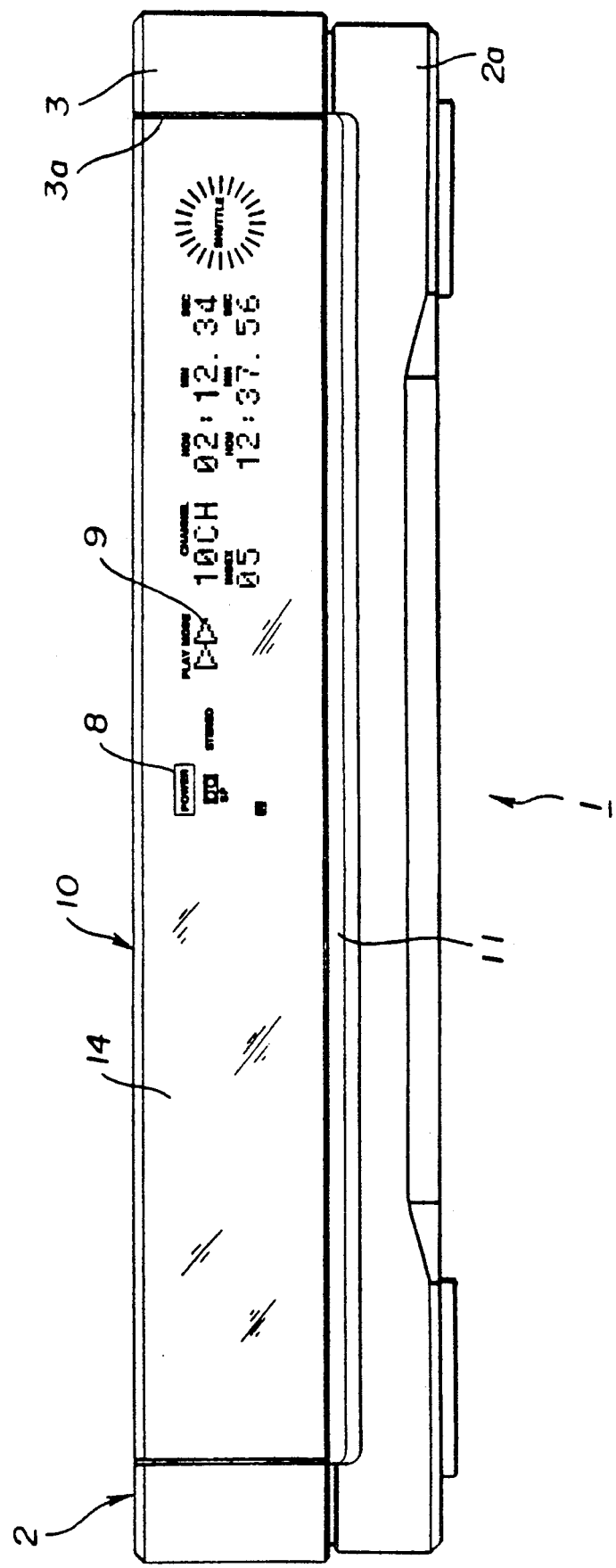
FIG. 2 is a front view of the cover of FIG. 1 is in a closed state.
Figure 3:
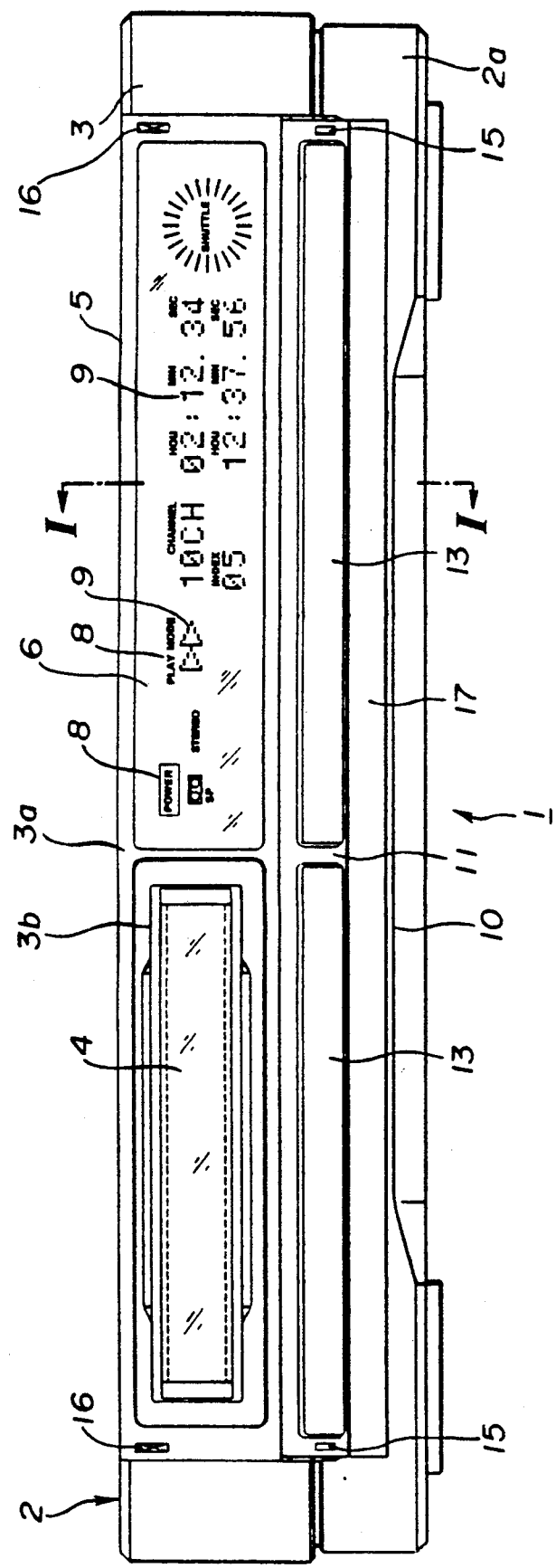
FIG. 3 is a front view of the cover according to the first embodiment, which is in an open state.
Figure 4:
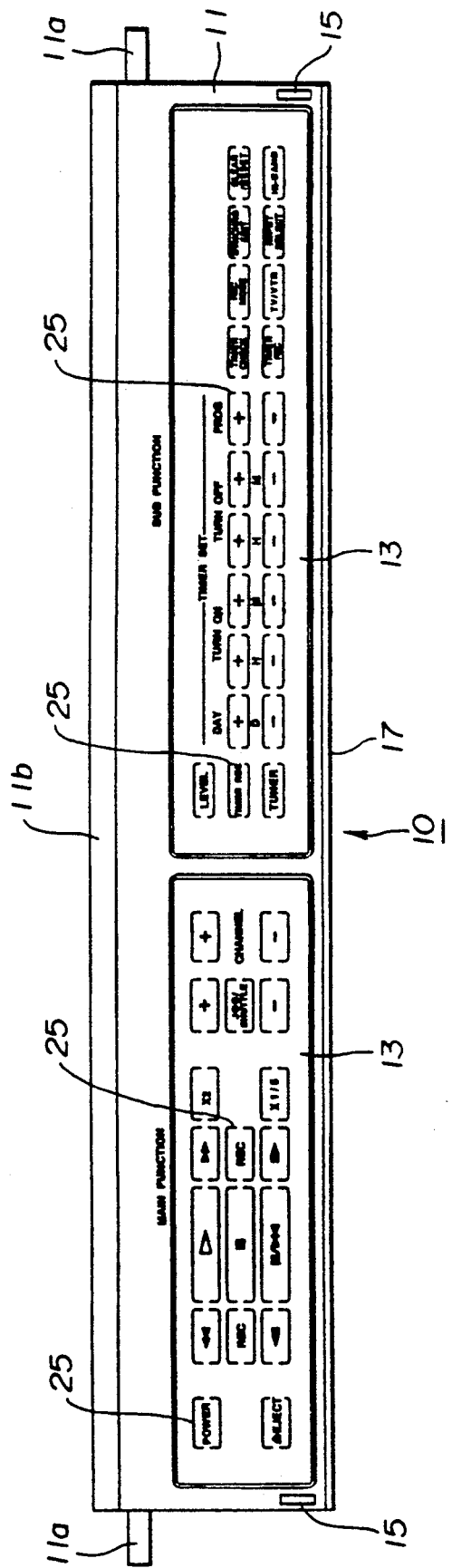
FIG. 4 is a plan view of the cover according to the first embodiment of the present invention, showing a rear face thereof on which various touch patterns are arranged.

Referring to FIGS. 1 to 3, a video tape recorder 1 includes a front panel 3 which is disposed on a front side of a housing body 2. The front panel 3 has a recess 3a on the central portion thereof, and a pair of rectangular openings 3b and 3c on both the left and right sides thereof. A tape cassette is inserted in and removed from the opening 3b which is covered with a cassette lid 4 made of a translucent acrylic resin. A display panel unit 5 for indicating ON/OFF of a power supply is fitted to the opening 3c. The display panel unit 5 consists of a rectangular display plate 6 made of translucent acrylic resin having a 50% transparency, and a rectangular display element (LCD) 7 made of a transparent acrylic resin which is spaced at a given distance from the display plate 6. Characters 8, such as "POWER", "PLAY MODE" and the like, are printed on an outer surface of the display plate 6 by silk screening, for example. Operational mode indications 9, such as symbols, numerals and the like, displayed on the display element 7 are visible through the display plate 6.

As shown in FIGS. 1 to 3, a cover 10 includes a rectangular frame 11 made of synthetic resin, a pair of transparent touch-sensitive panels 13, 13 of a rectangular shape, a pair of transparent display panels 14, 14 of a rectangular shape and a outer panel 17 made of translucent acrylic resin. The frame 11 has a pair of hinges 11a, 11a on both right and left sides of its lower part, which are formed integrally with the frame so as to extend outwardly therefrom in a longitudinal direction of the frame 11. The cover 10 is pivotably mounted through the hinges 11a, 11a on the front panel such that the cover is fitted into the recess 3a of the front panel 3 and hides therebehind the lid 4 and the display panel unit 5 when held in a closed position. The touch-sensitive panels 13, 13 are fitted to right and left openings formed on the frame 11. The display panels 14, 14 are also fitted to the right and left openings of the frame 11, spaced at a given distance from the touch-sensitive panels 13, 13. The outer panel 17 is attached onto the frame 11 by a bonding agent such as an adhesive so as to be spaced at a given distance from the display panels 14, 14 and continuously cover an outer face and upper wall of the frame 11.

The frame 11 is provided, at a bottom end thereof, with a tapered portion 11b which extends outwardly therefrom. The tapered portion 11b has a flat face and a slant face inclined relative to the flat face. As illustrated by a solid line in FIG. 1, when the cover 10 is open, the slant face contacts an upper face of a recess 3d formed at a lower part of the front panel 3. As indicated by θ in FIG. 1, the cover 10 slants by 20° relative to the horizontal direction so that the touch-sensitive panels 13, 13 are conveniently operable. On the other hand, as illustrated by a two-dot chain line of FIG. 1, when the cover 10 is closed, the flat face contacts a protruding portion 2c of a recess 2b which is formed on a base 2a of the housing body 2 of the video tape recorder 1. The cover 10 is fitted into the recess 3a of the front panel 3 and held in an upright position. The frame 11 further has a pair of metal plates 15, 15 on both right and left sides of its rear face. The metal plates 15, 15 are cooperated with a pair of magnets 16, 16 which are buried in a surface on both right and left sides of the recess 3a. Accordingly, the metal plates 15, 15 are attached to the magnets 16, 16 so that the cover 10 may be assuredly maintained in the closed state.

The touch-sensitive panels 13 are made of a transparent thin-plate which has a well known X-Y matrix switch structure (not shown in the drawings) and serves as an input device for the video tape recorder. The thin-plate includes a substrate made of glass, a thin glass sheet opposed to the substrate and an insulating spacer interposed between the substrate and the thin glass sheet. On the substrate are placed a plurality of transparent electrodes of a thin-film type extending in transverse or vertical direction. On the thin glass sheet are placed a plurality of transparent electrodes of a thin-film type extending in a direction perpendicular to that of the electrodes on the substrate. Operation modes, such as "Record", "Play", "Reverse", "Stop", and the like, of the video tape recorder 1 are selected by applying a soft pressing force onto given portions of the respective touch-sensitive panels 13, 13.

On a surface of the display panels 14, 14 there are provided touch patterns 25 such as "POWER (power supply)" and "REC (recording)" which are printed with a transparent ink medium at positions corresponding to operational positions on the touch-sensitive panels 13 opposingly disposed in the frame 11. The respective touch patterns 25 are reflected on the touch-sensitive panels 13, 13 by light emitted from a pair of light emitting diodes (LED) 23, 23 placed in a pair of holes 11c, 11c which are formed at a lower part of the frame 11. The light emitting diodes 23, 23 are connected to an electric energy supply source so as to automatically switch on each time the cover 10 is opened.

Since the outer panel 17 is made of translucent acrylic resin, for instance having a transparency of 20%, there is a contrast in transparency between the outer panel 17, and the touch-sensitive panel 13 and the display panel 14. Accordingly, as illustrated in FIG. 2, when the cover 10 is closed, the characters 8 and the operational mode indications 9 displayed on the display panel unit 5 of the front panel 3 are directly visible through the cover 10. Further, as shown in FIGS. 1 and 3, when the cover 10 is open, the touch patterns 25 printed on the display panels 14, 14 are clearly reflected on the touch sensitive panels 13, 13 by light emitted from the light emitting diodes 23, 23.

A second embodiment of a cover for a front panel of a video tape recorder according to the present invention will be described with reference to the accompanying drawings in which like numerals indicate like parts of the cover of the above described first embodiment, and therefore detailed explanations thereof are omitted hereinafter.

Figure 5:
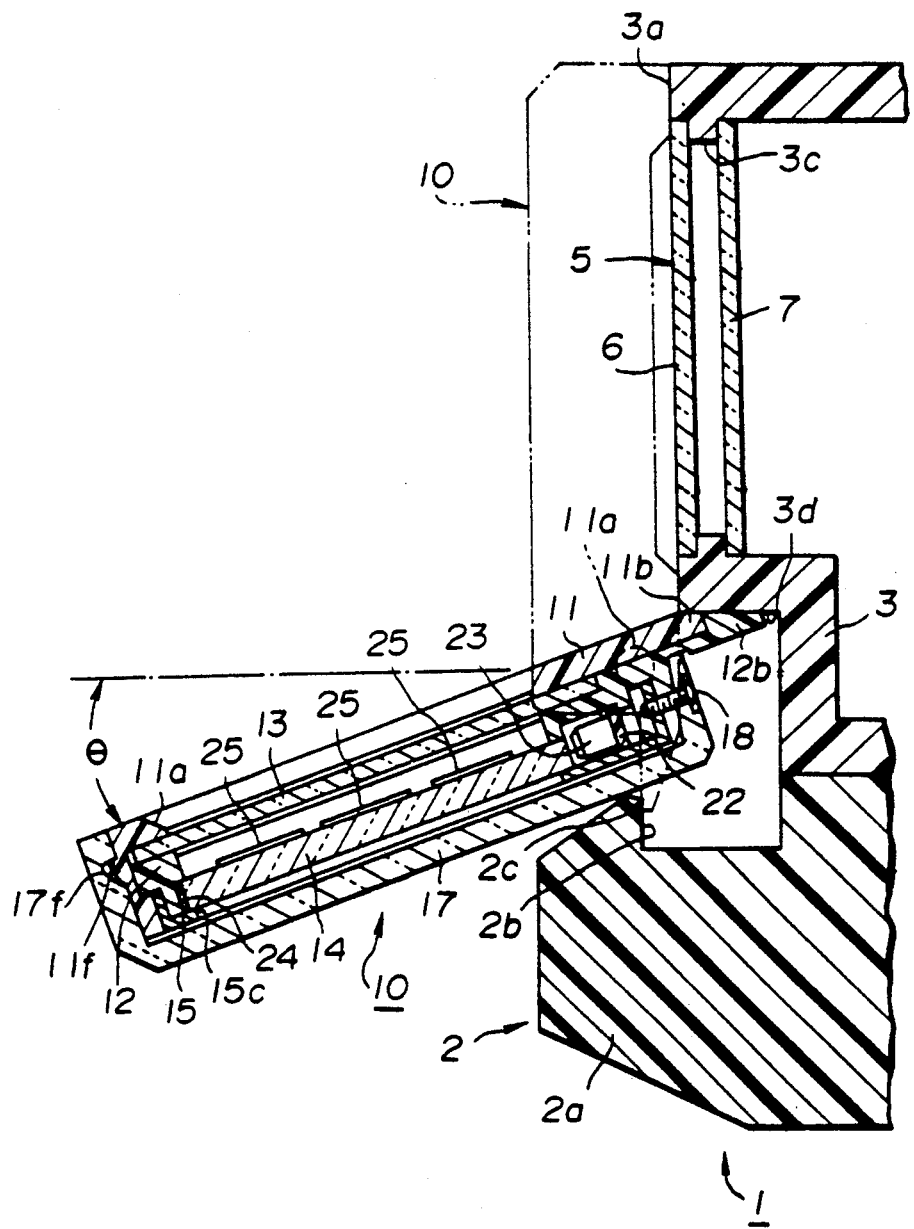
FIG. 5 is a sectional view of a cover for a indicator panel of a video tape recorder according to a second embodiment of the present invention, taken along line I—I in FIG. 7.
Figure 6:
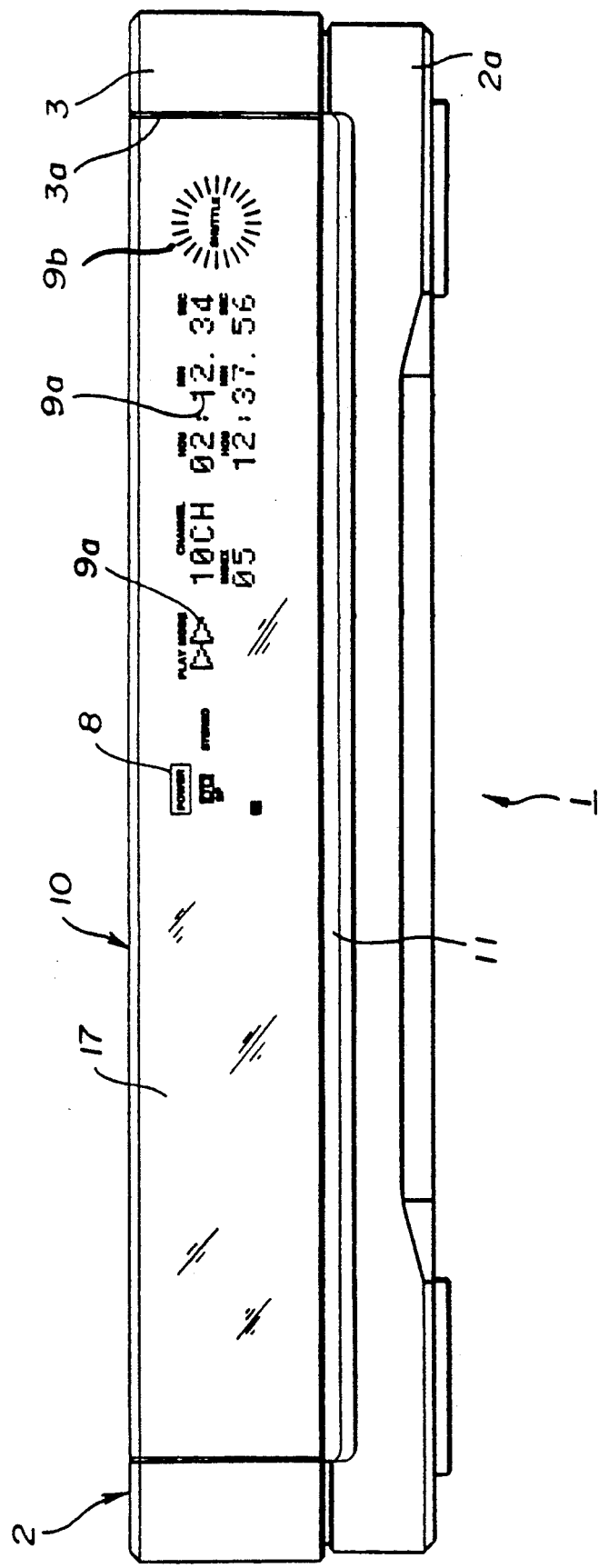
FIG. 6 is a front view of the cover according to the second embodiment of the invention, which is in a closed state.
Figure 7:
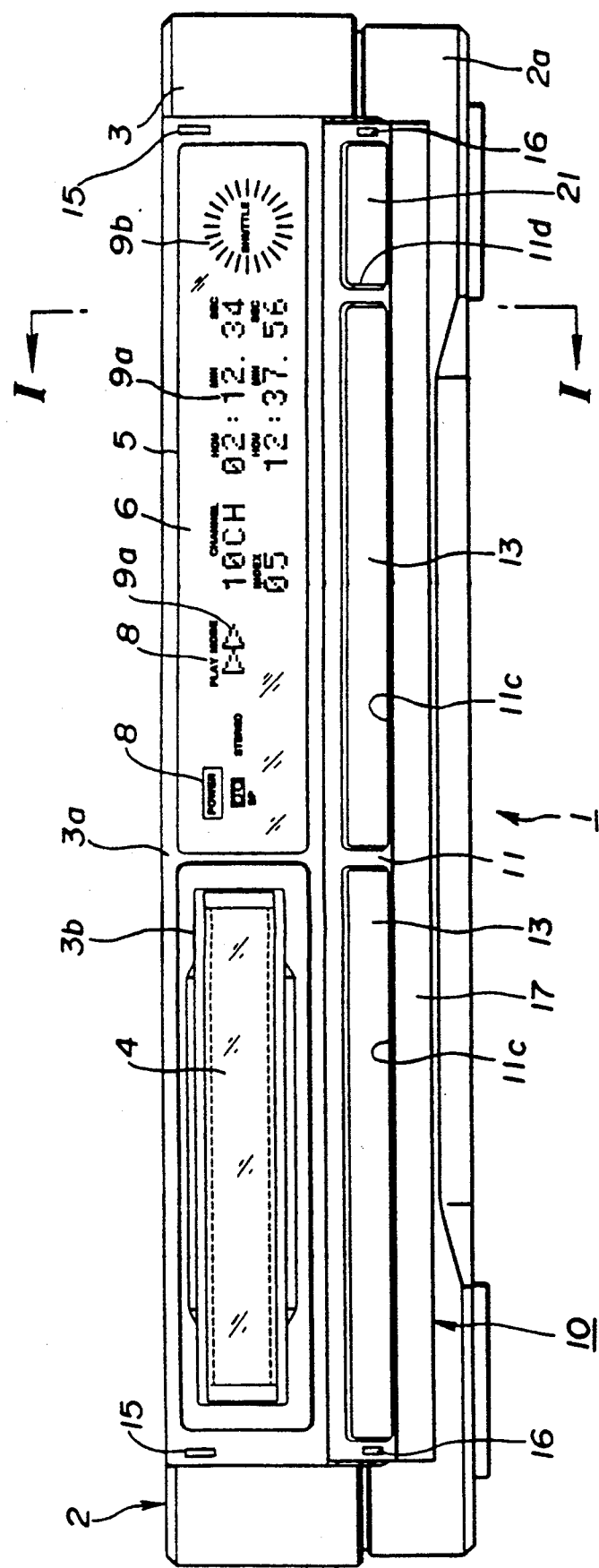
FIG. 7 is a front view of the cover according to the second embodiment, which is in an open state.

Referring to FIGS. 5 to 7, a video tape recorder 1 has a front panel 3 which is disposed on a front side of a housing body 2. The front panel 3 and a display panel unit 5 provided thereon have the same structure and material as in the aforementioned first embodiment. Operational mode indications 9a such as symbols, numerals and a tape rotation state 9b displayed on the display element 7 are visible through the display plate 6.

Figure 9:
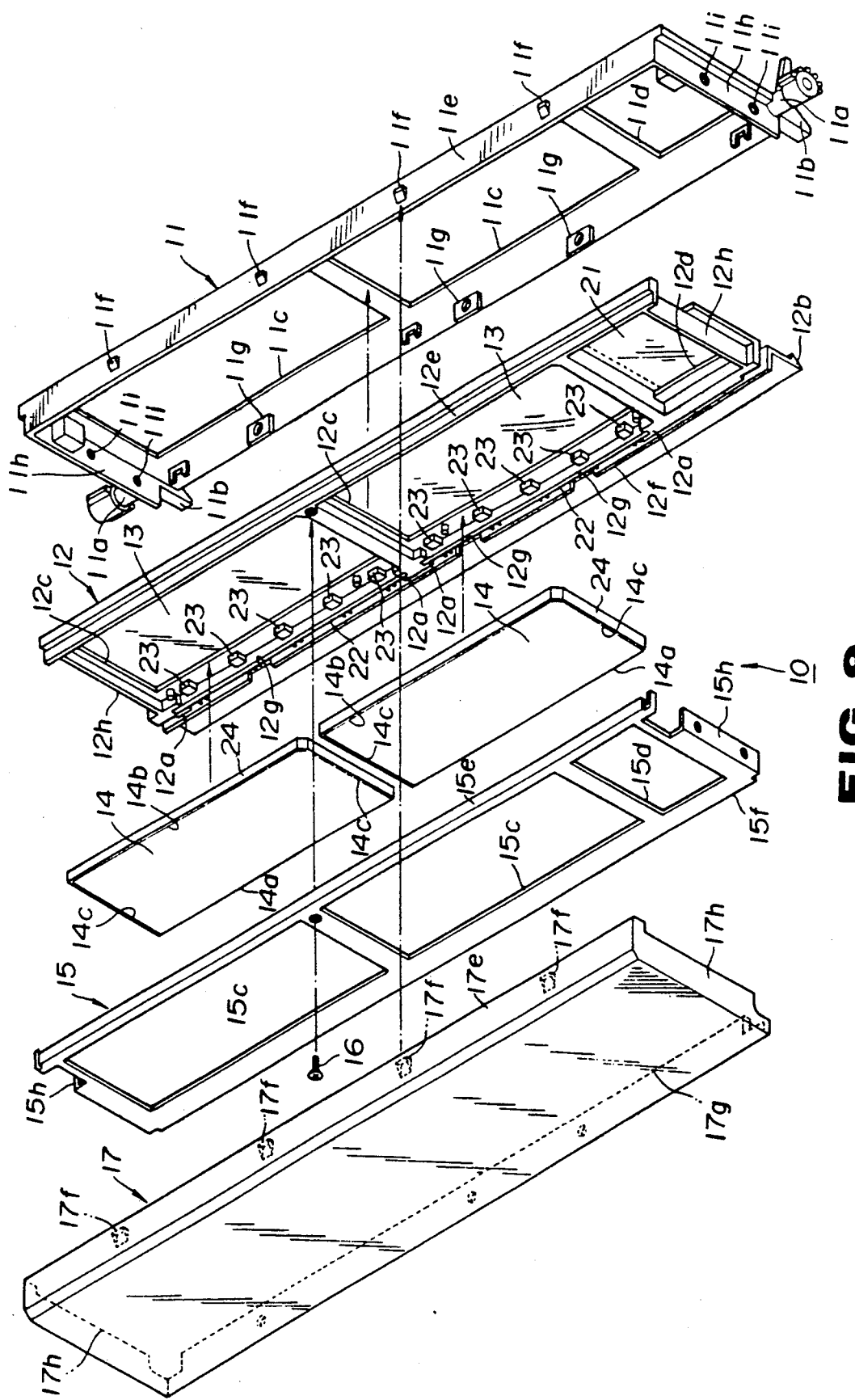
FIG. 9 is a perspective exploded view of each element of the cover according to the second embodiment of the invention.

As illustrated in FIGS. 5 and 9, a cover 10 includes a rectangular frame 11 made of synthetic resin, a rectangular panel holder 12 made of synthetic resin, a pair of transparent touch-sensitive panels 13, 13 of a rectangular shape, a pair of transparent display panels 14, 14 of a rectangular shape, a rectangular inner frame 15 made of metal, and a rectangular outer panel 17 made of translucent acrylic resin. The frame 11 is provided on both right and left side walls of a lower part thereof, with a pair of hinges 11a, 11a which are formed integrally with the frame 11 so as to extend outwardly therefrom in a longitudinal direction of the frame 11. The frame 11 is further provided on both right and left ends of a bottom edge thereof, with a pair of tapered portions 11b, 11b which extend outwardly therefrom. The panel holder 12 is also provided at a bottom end thereof, with a tapered portion 12b which extends outwardly therefrom. Each of the tapered portions 11b, 11b and 12b has a flat face and a slant face which is inclined relative to the flat face. The tapered portions 11b, 11b are fitted into a shoulder portion formed on the slant face side of the tapered portion 12b such that the slant faces of both the tapered portions 11b and 12b are flush with each other whereby an integral tapered projection serving as a stop for the cover 10 is formed at one end of the cover 10. As illustrated by a solid line in FIG. 5, when the cover 10 is open, the slant faces of the taper portions 11b, 11b and 12b contact an upper face of a recess 3d formed at a lower part of the front panel 3. As indicated by θ in FIG. 5, the cover 10 slants by 20° relative to the horizontal direction so that the touch-sensitive panels 13, 13 are conveniently operable. On the other hand, as illustrated by a two-dot chain line in FIG. 5, when the cover 10 is closed, the flat face of the taper portion 12b contacts a protruding portion 2c of a recess 2b which is formed on a base 2a of the housing body 2. The cover 10 is fitted in a recess 3a of the front panel 3 and settled in an upright position. The frame 11 further has a pair of magnets 16, 16 buried on both right and left sides of a rear face thereof. The magnets 16, 16 are cooperated with a pair of metal plates 15, 15 which are embedded on both right and left sides of the recess 3a. Accordingly, the metal plates 15, 15 are attached to the magnets 16, 16 so that the cover 10 may be assuredly maintained in the closed state.

Further, the frame 11 has a pair of rectangular openings 11c, 11c and a square opening 11d on the rear face thereof. The rectangular openings 11c, 11c are opposed to a cassette lid 4 and the display panel unit 5, respectively. The square opening 11d is opposed to a given portion of the display panel unit 5 where the tape rotation state 9b is indicated. The frame 11 also has a plurality of protrusions 11f, 11f which are formed on an outer surface of an upper side wall 11e thereof. The frame 11 is further provided with a plurality of tab portions 11g, 11g, at a lower part of a front face thereof. Each of the tab portions 11g, 11g is formed so as to extend perpendicularly from the front face of the frame 11 and parallel to the upper side wall 11e. The tab portion 11g has a tapped hole for receiving a screw. In addition, the frame 11 has a pair of through-holes 11i, 11i for receiving screws on each of the right and left side walls 11h, 11h thereof.

The panel holder 12 has a pair of rectangular openings 12c, 12c and a square opening 12d. When the panel holder 12 is fitted to the frame 11, the openings 12c, 12c and 12d are opposed to the openings 11c, 11c and 11d of the frame 11, respectively. The touch-sensitive panels 13, 13 are placed over the openings 12c, 12c such that the touch sensitive panels 13, 13 are fixedly adhered to a rear side face of the panel holder 12 along a peripheral edge of each opening 12c. The opening 12d is also covered with an acrylic plate 21 which is adhered to the rear side face of the panel holder 12 along a periphery of the opening 12d. The display panels 14, 14 are fitted into the openings 12c, 12c from a front side of the panel holder 12 so as to be spaced at a given distance from the touch-sensitive panels 13, 13. A lower side of a peripheral wall of the panel holder 12 along each opening 12c, namely a portion on the side of the tapered portion 12b, is cut away to form a space into which a light source base plate 22 is accomodated. Both ends of the light source base plate 22 are engaged into notches 12a, 12a formed on opposing cut-away corners, and retained therebetween. To this end, the base plates 22, 22 are opposed to lower edges 14a, 14a of the display panels 14, 14. On an upper surface of the base plates 22, 22, a plurality of light emitting diodes (LED) 23 are disposed spaced at uniform intervals from each other. The light emitting diodes 23 are connected to power supply switch (not shown) so as to be automatically turned on each time the cover 10 is opened. When the switch is turned on, the light emitting diodes 23 are energized and illuminates the display panels 14, 14 through the lower edges 14a, 14a. When the panel holder 12 and the frame 11 are assembled, tip ends of the tapered portions 11b, 11b engage with the shoulder portion of the tapered portion 12b. Further, a lower side wall 12f of the panel holder 12 has a plurality of notches which are flush with apertures 12g formed through the panel holder 12. When the panel holder 12 is fitted to the frame 11, the tab portions 11g are inserted in the apertures 12g and projected into the notches of the lower side wall 12f. In addition, an L-shaped flange is formed on the outside of each of the right and left side walls 12h, 12h so as to make a space for receiving right and left side walls 15h, 15h of the inner frame 15.

The touch-sensitive panels 13, 13 (not shown) are the same as those of the first embodiment, and therefore detailed explanation thereof is omitted.

As shown in FIG. 9, a reflective coating layer 24 made of a white paint is applied along outer edges 14b, 14c and 14c other than the lower edge 14a of each display panel 14. To this end, light emitted from the respective diodes 23 is irradiated inside of the display panel 14 without leaking from the edges 14b, 14c, 14c so that the whole part of the display panel 14 is uniformly illuminated. A surface of the display panel 14 which is opposed to the touch-sensitive panel 13 has a plurality of touch patterns 25 such as "POWER (power supply)", "REC (recording)" which are printed with a transparent ink medium at positions corresponding to operational positions on the touch-sensitive panel 13. The printed touch patterns 25 are reflected over the touch-sensitive panel 13 by light emitted from the illuminated display panel 14.

The inner frame 15 has a pair of rectangular openings 15c, 15c and a square opening 15d which are formed opposed to the openings 11c, 11c and 11d of the frame 11, respectively. An upper side wall 15e of the inner frame 15 is fitted to a gap between the upper side wall 11e of the frame 11 and the upper side wall 12e of the panel holder 12. A pair of right and left side walls 15h, 15h of the inner frame 15 are fitted to respective gaps formed between the right and left side walls 11h, 11h of the frame 11 and the right and left side walls 12h, 12h of the panel holder 12. A lower side wall 15f of the inner frame 15 is fitted into a space between the base plates 22, 22 of the panel holder 12 and the lower side wall 12f which is flush with the respective tab portions 11g of the frame 11 inserted through the aperture 12g of the panel holder 12. Each of the right and left side walls 15h, 15h is provided with a pair of through-holes which are flush with the through-holes 11i, 11i of the right and left side walls 11h, 11h. Accordingly, the right and left side walls 15h, 15h are tightened respectively on the right and left side walls 11h, 11h by screws (not shown in the drawings) which are inserted into the through-holes 11i and then the through-holes of the right and left side walls 15h, 15h. A central rib portion of the inner frame 15 on which a through-hole is formed, is tightened onto the panel holder 12 by a screw 16. To this end, the display panels 14, 14 are interposed and retained between the panel holder 12 and the inner frame 15.

The outer panel 17 is provided, on an inside of an upper side wall 17e thereof, with a plurality of recesses 17f which are formed so as to be opposed to the respective protrusions 11f of the frame 11. When the outer panel 17 and the frame 11 are assembled, the protrusions 11f each are engaged with the recesses 17f. A pair of right and left side walls 17h, 17h of the outer panel 17 are opposed to the right and left side walls 11h, 11h of the frame 11, respectively. A lower side wall 17g of the outer panel 17 on which a plurality of through-holes are formed is opposed to the lower side wall 12f of the panel holder 12. The through-holes of the outer panel 17 are flush with the tapped holes of the tab portions 11g of the frame 11. The outer panel 17 is fixed on the frame 11 by tightening screws 18 which are inserted into the flush through-holes of the lower side wall 17g and the tab portions 11g. As a result, when all the screws are tightened, the cover 10 is integrally assembled.

Since the outer panel 17 is made of translucent acrylic resin having, for instance, a transparency of 20%, there is a contrast in transparency between the outer panel 17, and the touch-sensitive panel 13 and the display panel 14. Accordingly, as illustrated in FIG. 6, when the cover 10 is closed, characters 8, the operational mode indications 9a and the tape rotation state 9b which are displayed on the display panel unit 5, are directly visible through the cover 10. Further, as shown in FIGS. 5 and 7, when the cover 10 is open, the touch patterns 25 printed on the display panels 14, 14 are clearly reflected on the touch-sensitive panels 13, 13 by light emitted from the respective light emitting diodes 23. Thus, an operation of the video tape recorder 1 is considerably facilitated by pressing the positions of the touch sensitive panels 13, 13 on which the corresponding touch patterns 25 are reflected or projected by light emitted from the light emitting diodes 23.

Figure 8:
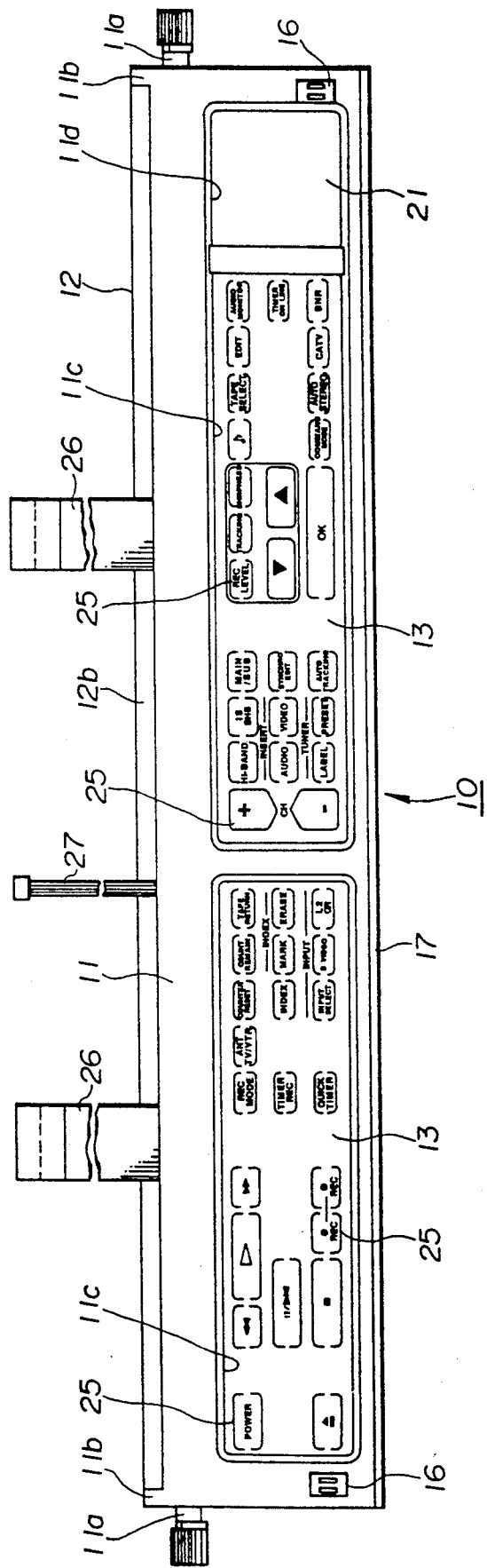
FIG. 8 is a plan view of the cover according to the second embodiment of the invention, showing a back side face thereof on which various touch patterns are arranged.

Referring to FIG. 8, reference numerals 26 and 27 represent a flexible cable for the touch-sensitive panel 13, and a connecting cord for the LEDs, respectively.

Although the cover is adapted for a video tape recorder in the preferred embodiments mentioned above, the cover according to the invention may be applicable for various electronic apparatus including audio and visual devices. Further, a transparent liquid crystal panel may be utilized as the transparent display panel. Not only light emitting diodes but also electro-luminescence or miniature lamps may be used as the light source. In addition, a reflective film of an adhesive tape type may be employed as the reflective coating layer applied along the edges of the display panel.

As is obvious from the aforementioned description of the preferred embodiments according to the present invention, a cover for electronic apparatus includes transparent touch-sensitive panels and transparent display panels, which differ in transparency from each other. Therefore, when the cover is closed, the characters and the operational mode indications displayed on the display panel unit which is disposed on the front panel of the apparatus housing body are visible through the cover. On the other hand, when the cover is open, the touch patterns provided on the display panels, are reflected on the touch-sensitive panels by light elmitted from a light source. Accordingly, the size and configuration of the touch patterns are not limited by those of the diplay panel unit. As a result, the touch patterns are desirably arranged on the display panels of the cover in view of operability and visibility that convenient operation can be achieved. Further to say, unecessary redundancy of display elements is avoided.

What is claimed is:

1. A cover for an indicator panel for electronic apparatus which is mounted on a recess formed on the indicator panel and pivotably movable so as to cover the indicator panel in a closed state, comprising:

a frame means being made of synthetic resin; said frame means having first and second openings, a pair of hinges extending outwardly from both sides thereof, and a tapered portion extending outwardly from the hinge-forming side of a lower side wall thereof; said frame means being pivotably supported on the indicator panel by said hinges; said tapered portion having a flat face and a slant face inclined relative to the flat face;

a pair of touch-sensitive panels being made of a transparent material; said touch-sensitive panels being fitted into the first and second openings of said frame means;

a pair of display panels being made of a transparent material; said display panels being mounted into the first and second openings and spaced at a given distance from said touch-sensitive panels; said display panels each having touch patterns printed with a transparent medium on a surface thereof;

an outer panel being made of translucent acrylic resin and disposed being spaced at a given distance from said display panels; and a plurality of light sources being provided in said frame means;

wherein said touch patterns printed on said display panels are reflected or projected on said touch-sensitive panels by light emitted from said light sources.

2. The cover according to claim 1, wherein said display panels are made of liquid crystal.

3. The cover according to claim 1, wherein said light sources are light emitting diodes, electro-luminescence elements or miniature lamps.

4. The cover according to claim 1, wherein a reflective coating layer is applied along outer edges of each of said display panels other than an edge opposed to said light sources.

5. The cover according to claim 4, wherein a reflective film which is in the form of an adhesive tape is used as said reflective coating layer.

6. A cover for an indicator panel of electronic apparatus which is mounted on a recess formed on the indicator panel and pivotably movable so as to cover the indicator panel in a closed state, comprising:

a frame means being made of synthetic resin; said frame means having first and second openings, a pair of hinges extending outwardly from both sides thereof, a pair of tapered portions extending outwardly from the hinge-forming sides of a lower side wall thereof, a plurality of protrusions formed on an outside of an upper side wall thereof, and a plurality of tab portions extending perpendicularly from a front side face thereof; said frame means being pivotably supported on the indicator panel by said hinges; said tapered portion having a flat face and a slant face inclined relative to the flat face;

a pair of touch-sensitive panels made of a transparent material; said touch-sensitive panels being fitted into the first and second openings of said frame means;

a panel holder being made of synthetic resin; said panel holder having first and second openings over which said touch-sensitive panels are placed such that said touch sensitive panels are fixedly adhered to a rear side face of the panel holder along peripheral edges of the openings, a tapered portion extending outwardly from a lower side wall thereof, and a plurality of apertures which are formed opposite to the tab portions of said frame means such that the tab portions are inserted thereinto when said frame means and said panel holder are assembled; said tapered portion having a flat face and a slant face inclined relative to the flat face and a shoulder portion into which the tapered portions of said frame means are fitted;

a pair of display panels being made of a transparent material; said display panels being mounted in the first and second openings and spaced at a given distance from said touch-sensitive panels; said display panels each having touch patterns printed with a transparent medium on a surface thereof;

an inner frame being made of metal; said inner frame being mounted on an outside of said panel holder such that said display panels are interposed between said panel holder and said inner frame;

an outer panel being made of translucent acrylic resin; said outer panel having a plurality of recesses which are formed opposite to the respective protrusions of said frame means so as to be engaged with the protrusions when said frame means and said outer panel are assembled; and a plurality of light sources being provided in said panel holder;

wherein said touch patterns printed on said display panels are reflected or projected on said touch-sensitive panels by light emitted from said light sources.

7. The cover according to claim 6, wherein said display panels are made of liquid crystal.

8. The cover according to claim 6, wherein said light sources are light emitting diodes, electro-luminescence elements or miniature lamps.

9. The cover according to claim 6, wherein a reflective coating layer is applied along outer edges of each of said display panels other than an edge opposed to said light sources.

10. The cover according to claim 9, wherein a reflective film which is in the form of an adhesive tape is used as said reflective coating layer.

* * * * *